(12) United States Patent
Andou et al.

(10) Patent No.: US 10,411,208 B2
(45) Date of Patent: Sep. 10, 2019

(54) DISPLAY DEVICE

(71) Applicant: Japan Display Inc., Minato-ku (JP)

(72) Inventors: Naohisa Andou, Minato-ku (JP); Kazuto Tsuruoka, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/671,400

(22) Filed: Aug. 8, 2017

(65) Prior Publication Data

US 2018/0062095 A1 Mar. 1, 2018

(30) Foreign Application Priority Data

Aug. 29, 2016 (JP) ................. 2016-166659

(51) Int. Cl.
*H01L 51/10* (2006.01)
*H01L 27/32* (2006.01)
*H01L 51/00* (2006.01)

(52) U.S. Cl.
CPC ........ *H01L 51/107* (2013.01); *H01L 27/3248* (2013.01); *H01L 51/0097* (2013.01); *H01L 27/32* (2013.01); *H01L 2251/5338* (2013.01); *Y02E 10/549* (2013.01)

(58) Field of Classification Search
CPC ............... H01L 51/107; H01L 51/3248; H01L 51/0097; H01L 27/32; H01L 27/3248; H01L 2251/5338; Y02E 10/549
See application file for complete search history.

(56) References Cited

U.S. PATENT DOCUMENTS

| 9,793,334 | B2 * | 10/2017 | Park ................... H01L 27/3276 |
| 2011/0050657 | A1 * | 3/2011 | Yamada .............. H01L 27/3293 345/204 |
| 2014/0217382 | A1 * | 8/2014 | Kwon ................. H01L 51/0097 257/40 |

(Continued)

FOREIGN PATENT DOCUMENTS

| JP | 2007-027222 | 2/2007 |
| KR | 10-2014-0099174 A | 8/2014 |
| KR | 10-2014-0122960 A | 10/2014 |

OTHER PUBLICATIONS

Office Action dated Sep. 18, 2018 in Korean Patent Application No. 10-2017-0107210, 8 pages (with English translation).

(Continued)

*Primary Examiner* — Hoan C Nguyen
(74) *Attorney, Agent, or Firm* — Oblon, McClelland, Maier & Neustadt, L.L.P.

(57) ABSTRACT

A display device includes: a spacer; a flexible substrate having flexibility, the flexible substrate being provided with a display area for performing image display, a picture-frame area, a bent area, and a terminal area including a terminal, the display area, the picture-frame area, the bent area, and the terminal area being arranged in this order, the terminal area being disposed on a rear surface side of the spacer due to the bent area being bent so as to follow the shape of the spacer; and a reinforcing film including a first reinforcing portion attached to the rear surface side of the display area, a second reinforcing portion attached to a display surface side of the terminal area, and a bent reinforcing portion attached to an inner surface side of the bent area at a portion in a width direction of the flexible substrate.

7 Claims, 11 Drawing Sheets

(56) References Cited

U.S. PATENT DOCUMENTS

2015/0021570 A1\* 1/2015 Kim ................... H01L 51/0097
                                                  257/40
2015/0179717 A1\* 6/2015 Kawata ............... H01L 29/7869
                                                  257/43
2016/0093685 A1\* 3/2016 Kwon ................. H01L 27/3276
                                                  257/40

OTHER PUBLICATIONS

Office Action dated Mar. 26, 2019 in Korean Patent Application No. 10-2017-0107210.

\* cited by examiner

DISPLAY DEVICE

CROSS-REFERENCE TO RELATED APPLICATION

The present application claims priority from Japanese application JP2016-166659 filed on Aug. 29, 2016, the content of which is hereby incorporated by reference into this application.

BACKGROUND OF THE INVENTION

1. Field of the Invention

The present invention relates to a display device.

2. Description of the Related Art

In recent years, in order to downsize a display device or increase a display area for displaying an image, narrowing a so-called picture-frame area (narrower picture-frame) located at the peripheral edge of the display area has been demanded. Especially in a mobile apparatus such as a smartphone, the demand for narrower picture-frame is growing.

Therefore, it is studied to achieve narrower picture-frame by using a flexible substrate having flexibility and by bending the area outside the display area onto the rear surface side of the display area. Wiring lines or circuits are provided in the area outside the display area. When the flexible substrate is bent, there is the possibility that the disconnection or breakage of the wiring line or the like may occur due to a stress acting on the bent portion; while, for example, JP 2007-027222 A discloses a configuration to prevent the disconnection or the like using a regulating film.

Here, it is considered to relax the stress acting on the flexible substrate by attaching a reinforcing film to the inner surface side of the bend of the flexible substrate. It is preferred to attach the reinforcing film to the portion where the stress is highest in the bent area of the flexible substrate, that is, on the inner surface side of the bent area, in which case the flexible substrate is hard to bend.

SUMMARY OF THE INVENTION

It is an object of the invention to provide a display device in which a flexible substrate is easy to bend and is reinforced.

A display device according to an aspect of the invention includes: a spacer; a flexible substrate having flexibility, the flexible substrate being provided with a display area for performing image display, a picture-frame area, a bent area, and a terminal area including a terminal, the display area, the picture-frame area, the bent area, and the terminal area being arranged in this order, the terminal area being disposed on a rear surface side of the spacer due to the bent area being bent so as to follow the shape of the spacer; and a first reinforcing film including a first reinforcing portion attached to the rear surface side of the display area, a second reinforcing portion attached to a display surface side of the terminal area, and a bent reinforcing portion attached to an inner surface side of the bent area at a portion in a width direction of the flexible substrate.

DETAILED DESCRIPTION OF THE INVENTION

Hereinafter, embodiments of the invention will be described with reference to the drawings.

In the embodiments of the invention, when the term "on" is simply used to express the form in which a structure is disposed "on" another structure, the term "on" includes both the case where a structure is disposed directly on another structure so as to be in contact therewith and the case where a structure is disposed above another structure with a third structure therebetween unless otherwise noted.

Figure 1:
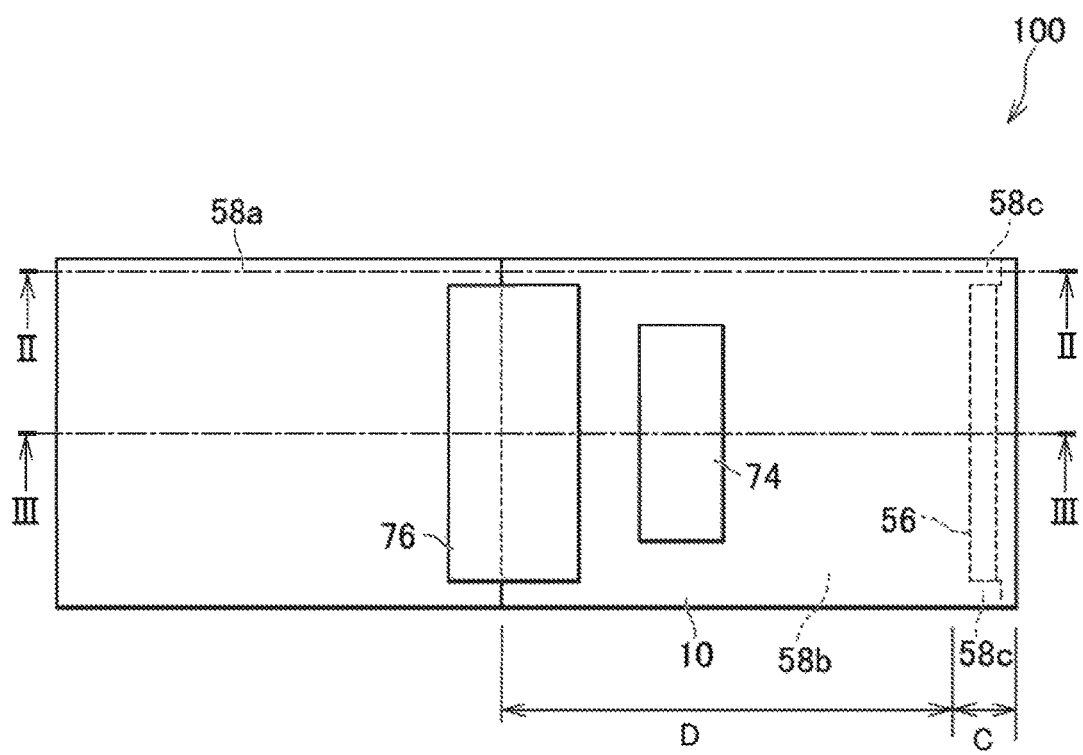
FIG. 1 is a plan view of a display device according to a first embodiment as viewed from the rear surface side.
Figure 2:
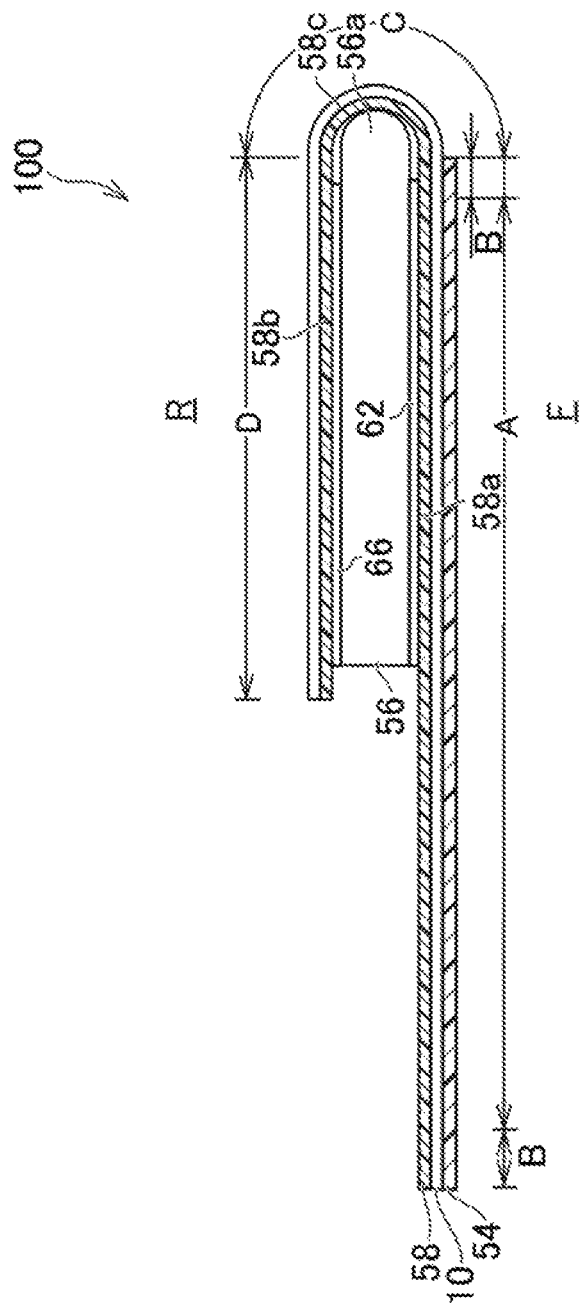
FIG. 2 is a cross-sectional view taken along line II-II in FIG. 1.
Figure 3:
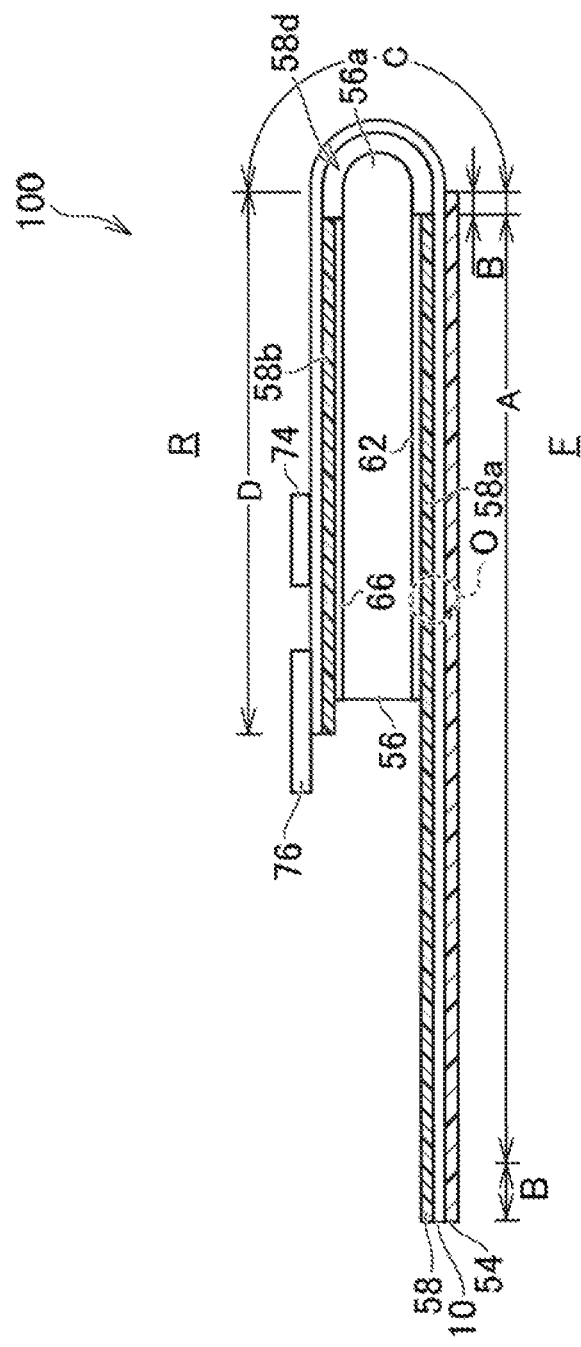
FIG. 3 is a cross-sectional view taken along line III-III in FIG. 1.

FIG. 1 is a plan view of a display device according to a first embodiment as viewed from the rear surface side. FIG. 2 is a cross-sectional view taken along line II-II in FIG. 1. FIG. 3 is a cross-sectional view taken along line III-III in FIG. 1. In the following description, the side (the lower side in FIG. 2, etc.) where an image is displayed in a display area A of a flexible substrate 10 is defined as a display surface side F, and the side (the upper side in FIG. 1, etc.) opposite to the display surface side F is defined as a rear surface side R.

In the first embodiment, an organic electroluminescent display device will be exemplarily described as a display device 100. However, the display device may be a liquid crystal display device or the like as long as the flexible substrate 10 is used in the display device. The display device 100 is configured such that unit pixels SP (sub-pixels) of multiple colors including red, green, and blue are combined to form a full-color pixel P (pixel), thereby displaying a full-color image (see FIG. 11).

Figure 4:
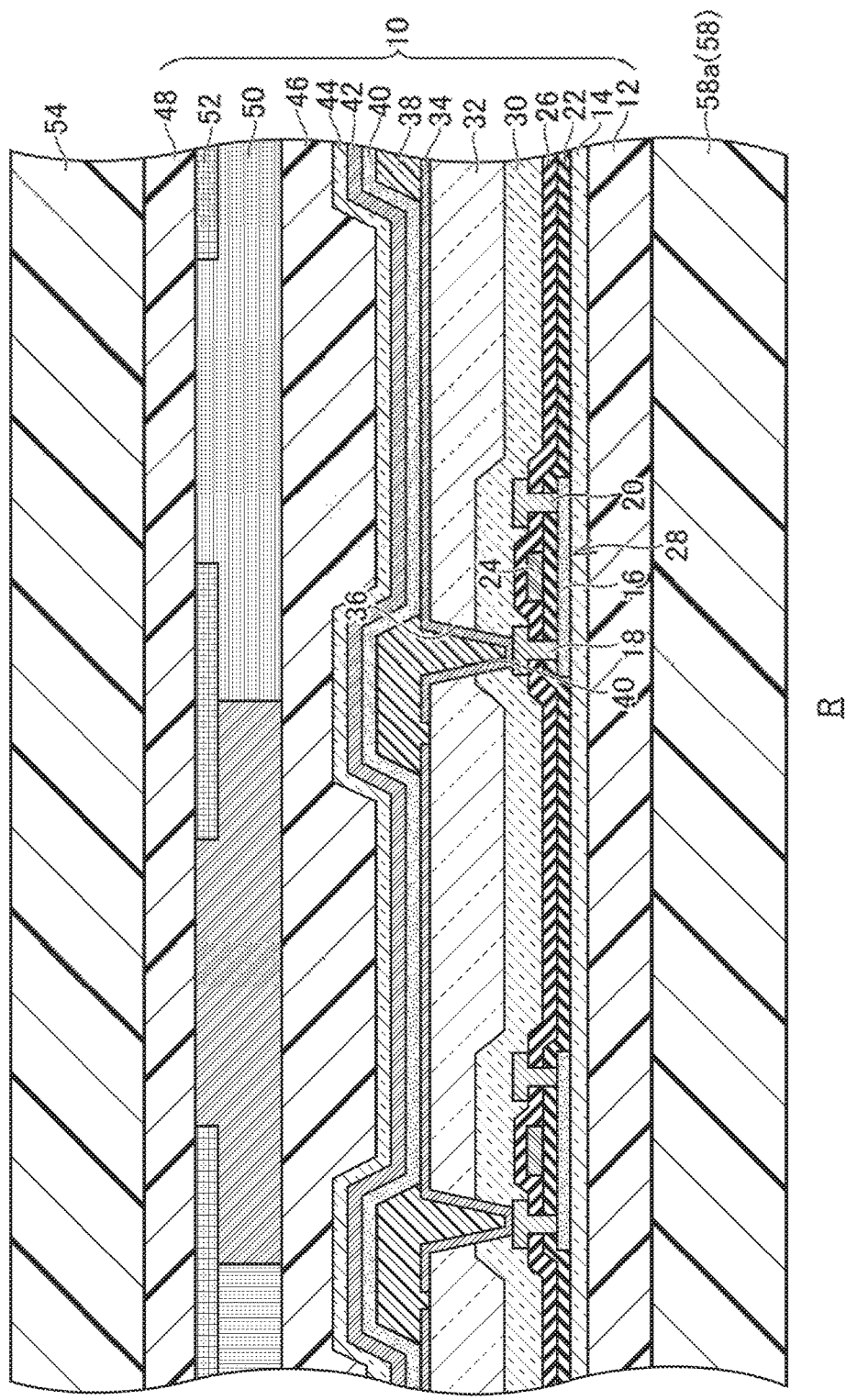
FIG. 4 is a cross-sectional view snowing in an enlarged manner a cross-section of at portion surrounded by the circle ○ indicated by the broken line in FIG. 3.
Figure 11:
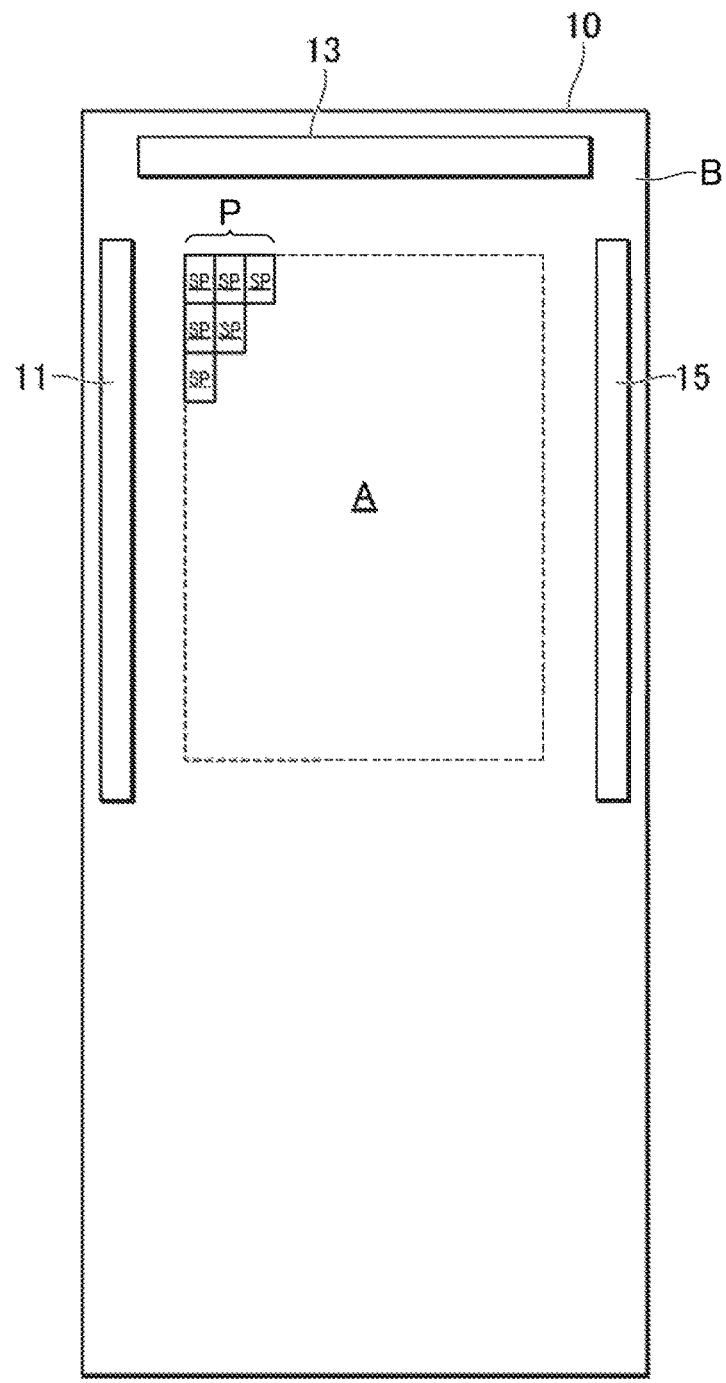
FIG. 11 is a plan view showing a pixel arrangement and peripheral circuits in a flexible substrate.

As shown in FIGS. 1 to 3, the display device 100 includes the flexible substrate 10, which has flexibility and is transparent. Hereinafter, the flexible substrate 10 and the surrounding configuration thereof will be described in detail with reference to FIGS. 4 and 11. FIG. 4 is a cross-sectional view showing in an enlarged manner a cross-section of a portion surrounded by the circle ○ indicated by the broken line in FIG. 3. Unlike the other cross-sectional views, the upper side in FIG. 4 is illustrated as the display surface side F while the lower side is illustrated as the rear surface side R. FIG. 11 is a plan view showing a pixel arrangement and peripheral circuits in the flexible substrate, showing the developed state of the flexible substrate. As shown in FIG. 11, the pixels P disposed in a matrix are provided in the display area A of the flexible substrate 10, and peripheral circuits 11, 13, and 15 are provided in a picture-frame area B to be described later. Although only some of the pixels P are shown in FIG. 11, the pixels P are provided substantially all over the display area A. Although not shown in the drawing, wiring lines such as gate lines and signal lines are provided to extend from the peripheral circuits 11, 13, and 15 to the display area A side. The signal lines extend from an integrated circuit chip 74, to be described later, to the pixels P.

As shown in FIG. 4, the flexible substrate 10 includes a first substrate 12 made of a resin. An undercoat 14 serving as a barrier to impurities contained in the first substrate 12 itself is formed on the first substrate 12, and a semiconductor layer 16 is formed on the undercoat 14. A source electrode 18 and a drain electrode 20 are electrically connected to the semiconductor layer 16, and a gate insulating film 22 is formed to cover the semiconductor layer 16. A gate electrode 24 is formed on the gate insulating film 22, and an inter-layer insulating film 26 is formed to cover the gate electrode 24. The source electrode 18 and the drain electrode 20 penetrate the gate insulating film 22 and the inter-layer insulating film 26. The semiconductor layer 16, the source electrode 18, the drain electrode 20, and the gate electrode 24 constitute a thin film transistor 28. A passivation film 30 is provided so as to cover the thin film transistor 28.

A planarization layer 32 is provided on the passivation film 30. A plurality of pixel electrodes 34 (e.g., anodes) configured so as to correspond to the plurality of unit pixels SP axe provided on the planarization layer 32. The planarization layer 32 is formed such that at least the surface on which the pixel electrode 34 is provided is flat. The pixel electrode 34 is electrically connected to one of the source electrode 18 and the drain electrode 20 on the semiconductor layer 16 through a contact hole 36 penetrating the planarization layer 32 and the passivation film 30.

An insulating layer 38 is formed on the planarization layer 32 and the pixel electrode 34. The insulating layer 38 is formed so as to lie on the peripheral edge of the pixel electrode 34 and open a portion (e.g., a central portion) of the pixel electrode 34. The insulating layer 38 forms a bank surrounding a portion of the pixel electrode 34.

A light-emitting element layer 40 is provided on the pixel electrode 34. The light-emitting element layer 40 continuously lies on the plurality of pixel electrodes 34 and also lies on the insulating layer 38. The light-emitting element layer 40 may be provided individually (separately) for each of the pixel electrodes 34. In this case, the light-emitting element layers 40 emit blue, red, and green lights corresponding to the respective pixels. In that case, it is not necessary to provide a color filter to be described later. The light-emitting element layer 40 includes at least a light-emitting layer, and may further include at least one layer of an electron transport layer, a hole transport layer, an electron injection layer, and a hole injection layer.

A common electrode 42 (e.g., a cathode) is provided on the light-emitting element layer 40 so as to be in contact with the light-emitting element layer 40 above the plurality of pixel electrodes 34. The common electrode 42 is formed so as to lie above the insulating layer 38 serving as a bank. The light-emitting element layer 40 is interposed between the pixel electrode 34 and the common electrode 42, and emits light with a luminance controlled by an electric current flowing therebetween.

The light-emitting element layer 40 is covered and thus sealed by a sealing layer 44 stacked on the common electrode 42, so that the light-emitting element layer 40 is shielded from moisture. A second substrate 48 is provided above the sealing layer 44 with a filling layer 46 therebetween. The second substrate 48 is provided with colored layers 50 of multiple colors (e.g., blue, red, and green), a black matrix 52 is formed of a metal, a resin, or the like between the adjacent colored layers 50 of different colors, and thus the color filter is configured. The second substrate 48 may be a touch panel, and may include a polarizer or a retardation film.

Figure 5:
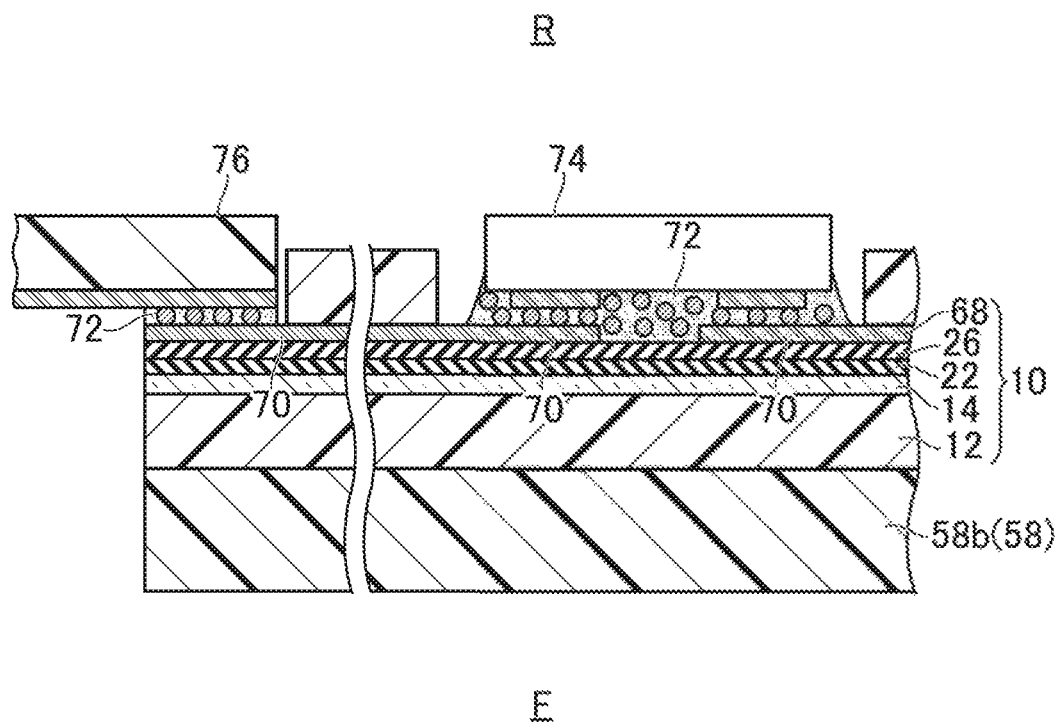
FIG. 5 is a cross-sectional view showing in an enlarged manner the vicinity of the end portion of a terminal area of a flexible substrate.

FIG. 5 is a cross-sectional view showing in an enlarged manner the vicinity of the end portion of a terminal area D (see FIG. 3, etc.) of the flexible substrate 10. A wiring line 68 is provided in the terminal area D. The wiring line 68 passes from the display area A through the picture-frame area B and a bent area C and reaches the end portion of the terminal area D. The wiring line 68 is formed in, for example, the same layer as the source electrode 18 and the drain electrode 20. The wiring line 68 includes a terminal 70. The terminal 70 is electrically connected to the integrated circuit chip 74 or a flexible printed circuit (FPC) board 76 through an anisotropic conductive film 72. The integrated circuit chip 74 may be disposed, not on the flexible substrate 10, but on the FPC board 76.

Figure 6:
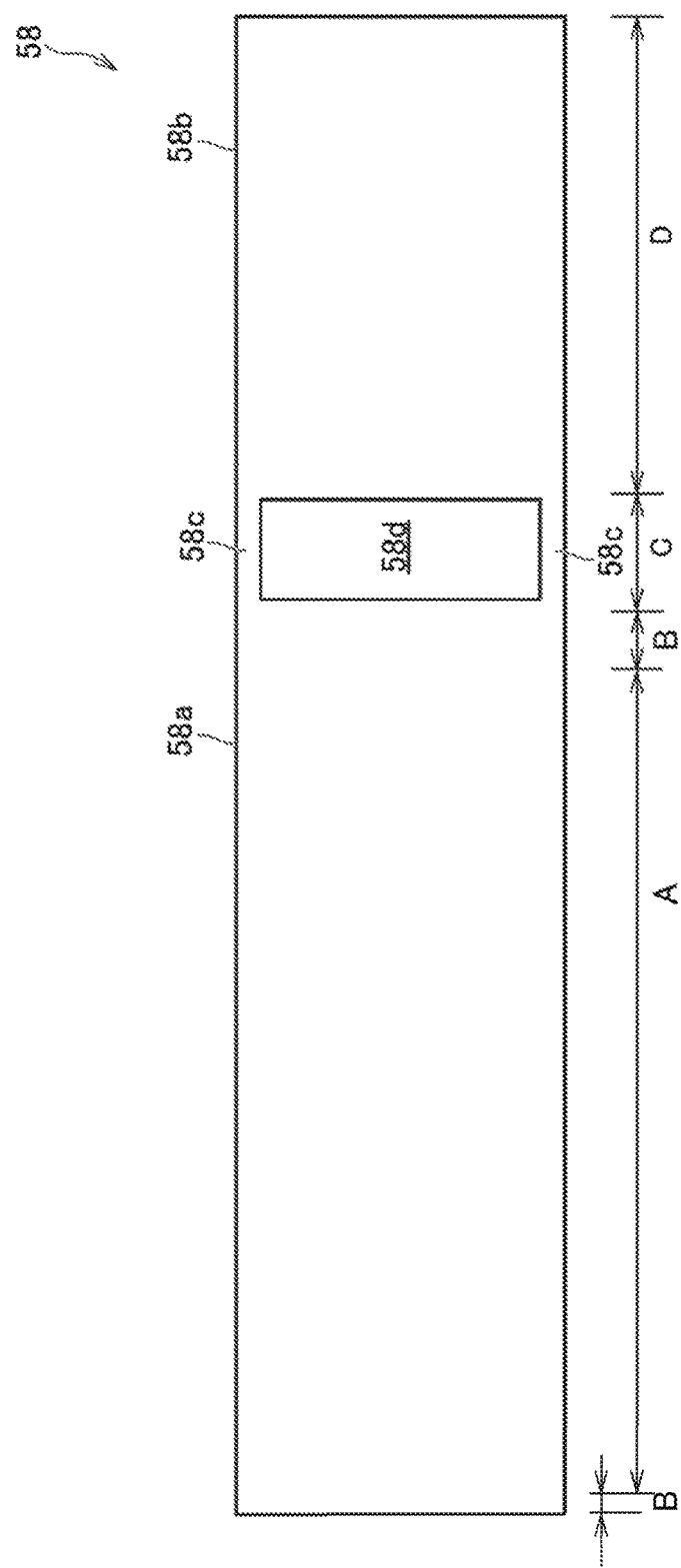
FIG. 6 is a plan view showing a back reinforcing film.

Further, the overall configuration of the display device 100 according to the first embodiment will be described with reference to FIGS. 1 to 3 and 6. FIG. 6 is a plan view showing a back reinforcing film in the developed state (the state before being bent). Signs A to D in FIG. 6 show areas (areas to be attached) of the back reinforcing film 58 respectively corresponding to the display area A, the picture-frame area B, the bent area C, and the terminal area D of the flexible substrate 10 shown in FIGS. 1 to 3.

As shown in FIGS. 1 and 3, the display device 100 includes, in addition to the flexible substrate 10, a spacer 56, a front reinforcing film 54, the back reinforcing film 58, the integrated circuit chip 74, and the FPC board 76. The front reinforcing film 54 and the back reinforcing film 58 are provided to protect and reinforce the flexible substrate 10. The spacer 56 is provided to guide the bend of the flexible substrate 10.

The flexible substrate 10 is provided with the display area A for performing image display, the picture-frame area B at the peripheral edge of the display area A, the bent area C, and the terminal area D including terminals, which are arranged in this order. The picture-frame area B is provided so as to surround the four sides of the display area A in a plan view. The bent area C has a bent shape so as to follow the shape of a guide portion 56a of the spacer 56. The terminal area D is disposed on the rear surface side R of the spacer 56 due to the bending of the bent area C.

As shown in FIG. 2 and the like, the front reinforcing film 54 is provided on the display surface side F of the display area A and the picture-frame area B of the flexible substrate 10 so as not to overlap the bent area C.

As shown in FIGS. 1 to 3 and 6, the back reinforcing film 58 includes a first reinforcing portion 58a attached to the rear surface side R of the display area A, a second reinforcing portion 58b attached to the display surface side F of the terminal area D, and bent reinforcing portions 58c provided on the inner surface side of the bent area C at both edges in the width direction of the flexible substrate 10.

In the first embodiment, the first reinforcing portion 58a and the second reinforcing portion 58b are connected through the bent reinforcing portions 58c. That is, it can be said that the back reinforcing film 58 is one film having a cutout 58d formed therein (see FIG. 6). FIG. 2 shows a cutting plane passing through the bent reinforcing portion 58c. FIG. 3 shows a cutting plane passing through the cutout 58d.

As shown in FIGS. 2 and 3, the second reinforcing portion 58b of the back reinforcing film 58 is attached to a surface of the spacer 56 on the rear surface side R with an adhesive member 66. The first reinforcing portion 58a of the back reinforcing film 58 is attached to a surface of the spacer 56 on the display surface side F with an adhesive member 62. The adhesive member 62 and the adhesive member 66 may be made of a resin having adhesion, or the like, or may be a double-faced tape or the like. Although the bent reinforcing portion 58c is not bonded to the spacer 56 with an adhesive member as shown in FIG. 2, an adhesive member may be provided also on the guide portion 56a of the spacer 56. Moreover, for example, a resin having adhesion may be filled as an adhesive member in the cutout 58d, and the bent area C of the flexible substrate 10 and the guide portion 56a of the spacer 56 may be directly bonded together through the cutout 58d.

In the spacer 56, the guide portion 56a guiding the bend of the bent area C of the flexible substrate 10 has a rounded shape in a cross-sectional view as shown in FIGS. 2 and 3. Since the guide portion 56a has the shape described above, the disconnection or breakage of the wiring line 68 or the like is less likely to occur in the bent area C of the flexible substrate 10.

In the first embodiment, the configuration in which the back reinforcing film 58 is provided on the inner surface side of the bend of the flexible substrate 10 is employed. Therefore, a stress acting on the flexible substrate 10 can be relaxed, and it is possible to suppress the disconnection or the like of the wiring line of the flexible substrate 10. While the stress is most likely to occur in the bent area C, the bent reinforcing portion 58c is attached to the bent area C, thereby providing a configuration to further facilitate the relaxation of the stress. In the first embodiment, the configuration in which the bent reinforcing portions 58c are provided at both edges in the width direction of the flexible substrate 10 has been shown. However, the invention is not limited to this configuration, and it is sufficient that the bent reinforcing portion 58c is provided at at least a portion in the width direction of the flexible substrate 10.

The display device 100 is manufactured by the method described below. First, the flexible substrate 10 in the developed state is prepared, and the back reinforcing film 58 is attached to the flexible substrate 10. Then, the spacer 56 is prepared. The adhesive member 62 is provided on the display surface side F of the spacer 56, and the adhesive member 66 is provided on the rear surface side R. Then, the spacer 56 is disposed on the first reinforcing portion 58a of the back reinforcing film 58 attached to the flexible substrate 10, and the spacer 56 is fixed to the flexible substrate 10 with the adhesive member 62. Further, the bent area C and the bent reinforcing portions 58c are bent so as to follow the shape of the guide portion 56a of the spacer 56, and the terminal area D is disposed on the rear surface side R of the spacer 56. At this time, the second reinforcing portion 58b of the back reinforcing film 58 is fixed to the rear surface side R of the spacer 56 with the adhesive member 66. With this configuration, the bent state of the bent area C of the flexible substrate 10 is maintained, and the display device 100 is brought into the state shown in FIGS. 1 to 3.

Figure 7:
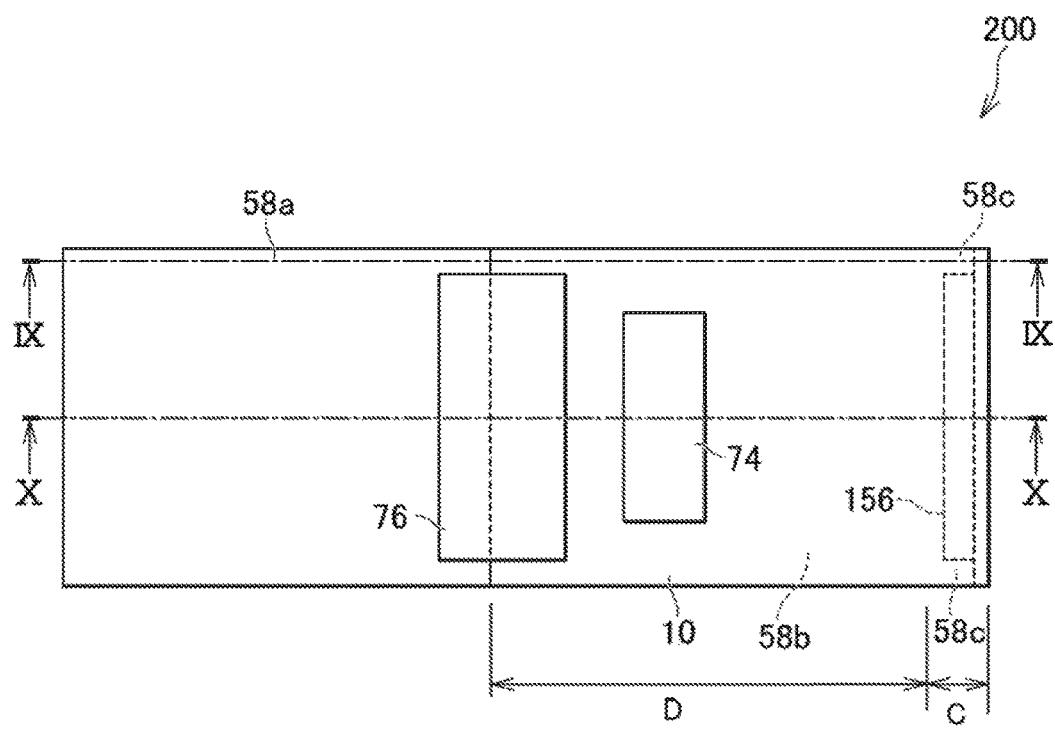
FIG. 7 is a plan view of a display device according to a second embodiment as viewed from the rear surface side.
Figure 8:
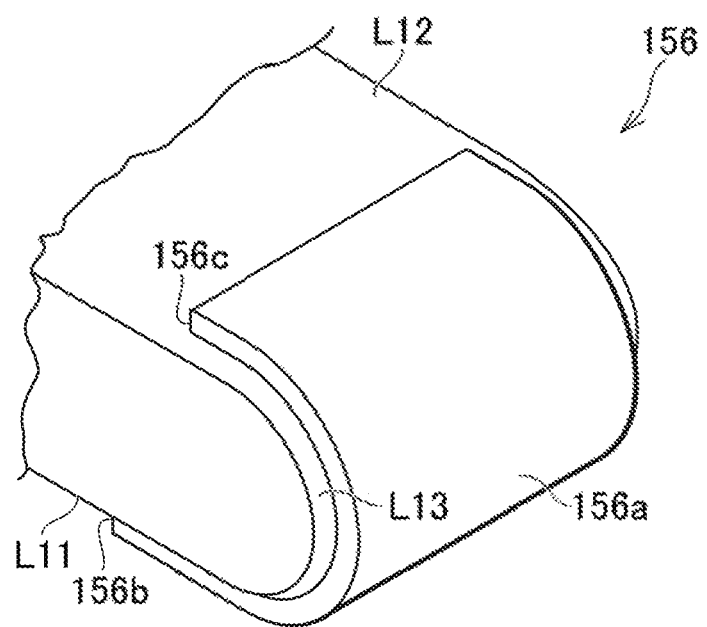
FIG. 8 is a perspective view showing as portion of a spacer according to the second embodiment.
Figure 9:
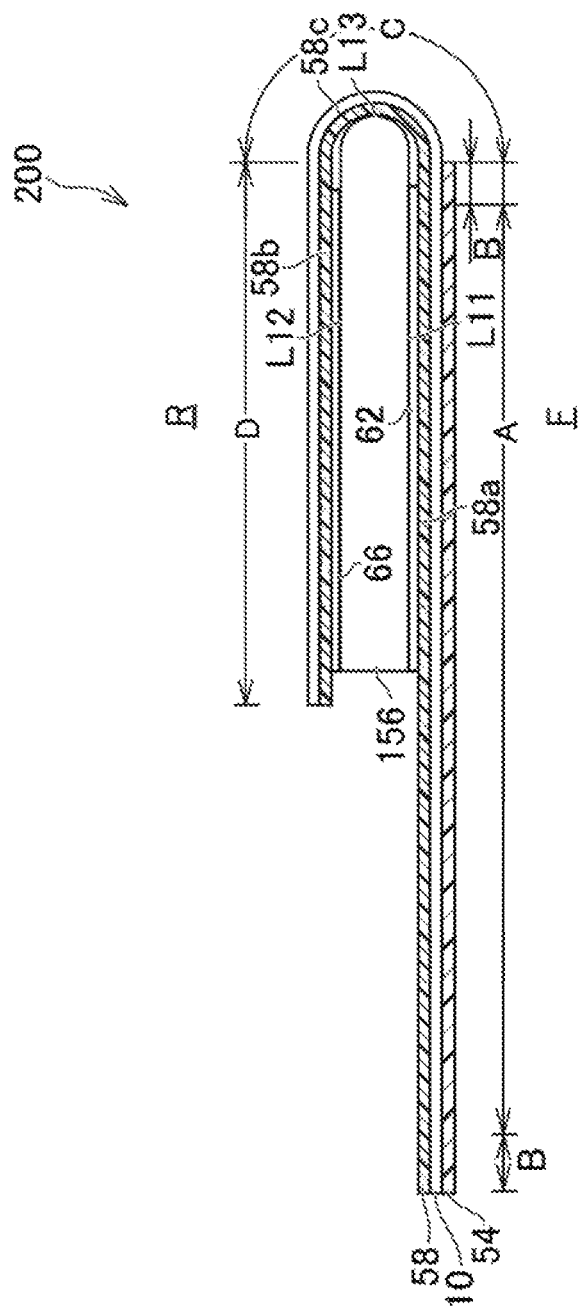
FIG. 9 is a cross-sectional view taken along line IX-IX in FIG. 7.
Figure 10:
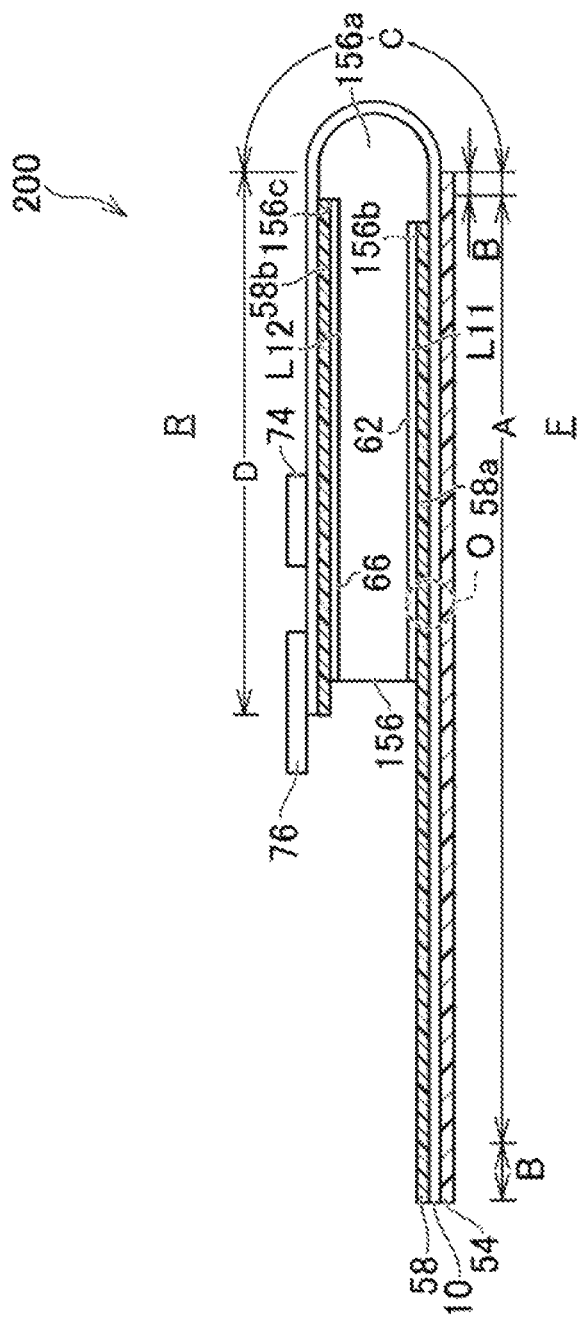
FIG. 10 is a cross-sectional view taken along line X-X in FIG. 7.

Next, a display device 200 according to a second embodiment will be described with reference to FIGS. 7 to 10. FIG. 7 is a plan view of the display device according to the second embodiment as viewed from the rear surface side. FIG. 8 is a perspective view showing a portion of a spacer of the second embodiment. FIG. 9 is a cross-sectional view taken along line IX-IX in FIG. 7. FIG. 10 is a cross-sectional view taken along line X-X in FIG. 7. The same reference numerals and signs are used for the same configurations as those described in the first embodiment, and the description of the configurations is omitted.

As shown in FIG. 8, the spacer 156 of the second embodiment includes a guide portion 156a that guides the bend of the bent area C of the flexible substrate 10 similarly to the spacer 56 of the first embodiment. Moreover, the spacer 156 includes a first bottom surface L11 recessed from the guide portion 156a due to the formation of a first step 156b, a second bottom surface L12 recessed from the guide portion 156a due to the formation of a second step 156c, and third bottom surfaces L13 that are the same surface as the first bottom surface L11 and the second bottom surface L12 and follow the shape of the guide portion 156a. The first bottom surface L11 is a surface of the spacer 156 on the display surface side F. The second bottom surface L12 is a surface of the spacer 156 on the rear surface side R. The third bottom surfaces L13 are formed at both edges of the spacer 156 in the width direction thereof.

The display device 200 includes the flexible substrate 10 and the back reinforcing film 58 attached to the inner surface side of the bend of the flexible substrate 10. The configuration of the back reinforcing film 58 is similar to that described in the first embodiment. In the second embodiment, the first reinforcing portion 56a is attached on the first bottom surface L11, the second reinforcing portion 58b is attached on the second bottom surface L12, and the bent reinforcing portions 58c are attached on the third bottom surfaces L13. FIG. 9 shows a cutting plane passing through the bent reinforcing portion 58c and the third bottom surface L13. FIG. 10 shows a cutting plane passing through the cutout 58d and the guide portion 156a.

The height of the first step 156b is substantially equal to the sum of the thicknesses of the adhesive member 62 and the back reinforcing film 58. Similarly, the height of the second step 156c is substantially equal to the sum of the thicknesses of the adhesive member 66 and the back reinforcing film 58.

The second step 156c is formed closer to the end portion of the guide portion 156a than the first step 156b. In this manner, the first step 156b and the second step 156c are formed at different positions in the direction (the left-and-right direction in FIGS. 9 and 10) in which the flexible substrate 10 extends and contracts due to bending. Moreover, as shown in FIGS. 9 and 10, an edge portion of the first reinforcing portion 58a of the back reinforcing film 58 closer to the bent area C and an edge portion of the front reinforcing film 54 closer to the bent area C are disposed at different positions in the direction in which the flexible substrate 10 extends and contracts due to bending. When the edge portion of the back reinforcing film 58 and the edge portion of the front reinforcing film 54 are disposed at the same position in the direction in which the flexible substrate 10 extends and contracts, a load may locally occur at the position in the flexible substrate 10; while a load to the flexible substrate 10 is dispersed in the configuration of the second embodiment. Therefore, the disconnection or the like of the wiring line of the flexible substrate 10 is less likely to occur.

In the display device 200 of the second embodiment, the guide portion 156a of the spacer 156 and the bent area C of the flexible substrate 10 are in direct contact with each other through the cutout 58d of the back reinforcing film 58 as shown in FIG. 10. Therefore, compared to the display device 100 of the first embodiment, the gaps generated between the flexible substrate 10 and the back reinforcing film 58, and the spacer 156 are reduced. Therefore, the flexible substrate 10 and the back reinforcing film 58 can be bent more stably, and also a configuration in which a load is less likely to be applied to the flexible substrate 10 is provided.

In the second embodiment, the configuration in which the edge face of the first reinforcing portion 58a abuts the first step 156b has been shown. However, the invention is not limited to this configuration, and a configuration in which the edge face of the first reinforcing portion 58a is spaced apart from the first step 156b to provide a gap therebetween may be employed. Similarly, a configuration in which the edge face of the second reinforcing portion 58b is spaced apart from the second step 156c to provide a gap therebetween may be employed.

The back reinforcing film 58 in the embodiments is a configuration corresponding to a first reinforcing film of the invention, and the front reinforcing film 54 is a configuration corresponding to a second reinforcing film of the invention.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a spacer;
    a flexible substrate having flexibility, the flexible substrate being provided with a display area for performing image display, a picture-frame area, a bent area, and a terminal area including a terminal, the display area, the picture-frame area, the bent area, and the terminal area being arranged in this order, the terminal area being disposed on a rear surface side of the spacer due to the bent area being bent so as to follow a shape of the spacer; and
    a first reinforcing film including a first reinforcing portion attached to a rear surface side of the display area, a second reinforcing portion attached to a display surface side of the terminal area, and a bent reinforcing portion attached to an inner surface side of the bent area, wherein
    in a first cross sectional view in a thickness direction of the flexible substrate through the display area, the first reinforcing portion and the second reinforcing portion are separated by the bent area, and
    in a second cross sectional view in a thickness direction of the flexible substrate through the picture-frame area, the first reinforcing film is continuously formed from the first reinforcing portion to the second reinforcing portion via the bent reinforcing portion.

2. The display device according to claim 1, wherein the bent reinforcing portion is provided at both edges in the width direction of the flexible substrate.

3. The display device according to claim 1, further comprising:
    an IC driver on a rear surface side of the terminal area; and
    a flexible circuit board connected to the terminal on the rear surface side of the terminal area.

4. The display device according to claim 1, wherein the spacer includes a guide portion that guides a bend of the bent area, a first bottom surface recessed from the guide portion due to a formation of a first step, a second bottom surface recessed from the guide portion due to a formation of a second step, and a third bottom surface that is a same surface as the first bottom surface and the second bottom surface and has a shape following the guide portion, and
    the first reinforcing portion is provided on the first bottom surface, the second reinforcing portion is provided on the second bottom surface, and the bent reinforcing portion is provided on the third bottom surface.

5. The display device according to claim 4, wherein the first step and the second step are formed at different positions in a direction in which the flexible substrate extends and contracts due to bending.

6. The display device according to claim 4, wherein
    in the second cross sectional view, the first reinforcing portion is provided on the first bottom surface, the second reinforcing portion is provided on the second bottom surface, and the bent reinforcing portion is provided on the third bottom surface, and
    in the first cross sectional view, the first reinforcing portion is provided on the first bottom surface, the second reinforcing portion is provided on the second bottom surface, and the bent reinforcing portion is not provided on the third bottom surface so that the guide portion is in contact with the flexible substrate.

7. The display device according to claim 1, further comprising a second reinforcing film attached to a display surface side of the display area, wherein
    an edge portion of the first reinforcing portion and an edge portion of the second reinforcing film are disposed at different positions in a direction in which the flexible substrate extends and contracts due to bending.

* * * * *